United States Patent [19]

Imai et al.

[11] Patent Number: 5,468,997

[45] Date of Patent: Nov. 21, 1995

[54] INTEGRATED CIRCUIT PACKAGE HAVING A MULTILAYERED WIRING PORTION FORMED ON AN INSULATING SUBSTRATE

[75] Inventors: Ryuji Imai; Rokuro Kanbe, both of Aichi, Japan

[73] Assignee: NGK Spark Plug Co., Ltd., Aichi, Japan

[21] Appl. No.: 368,384

[22] Filed: Dec. 30, 1994

Related U.S. Application Data

[63] Continuation of Ser. No. 102,963, Aug. 6, 1993, abandoned, which is a continuation of Ser. No. 895,995, Jun. 8, 1992, abandoned.

[30] Foreign Application Priority Data

Jun. 10, 1991 [JP] Japan ..................... 3-137949

[51] Int. Cl.[6] ............................ H01L 23/48; H01L 29/44
[52] U.S. Cl. .................... 257/734; 257/723; 257/724; 257/758; 257/777
[58] Field of Search ................ 357/74, 80; 257/690, 257/691, 692, 697, 734, 758, 759, 760, 773, 774, 775, 698, 774, 775, 798, 735, 736, 777, 723, 724, 729

[56] References Cited

U.S. PATENT DOCUMENTS

| | | | |
|---|---|---|---|
| 3,688,018 | 8/1972 | Hiscocks | 257/698 |
| 4,221,047 | 9/1980 | Narken et al. | 357/80 |
| 4,649,417 | 3/1987 | Burgess et al. | 257/691 |
| 4,811,082 | 3/1989 | Jacobs et al. | 357/80 |

FOREIGN PATENT DOCUMENTS 63-115399  5/1988  Japan .

*Primary Examiner*—Sara W. Crane
*Assistant Examiner*—Carl Whitehead, Jr.
*Attorney, Agent, or Firm*—Finnegan, Henderson, Farabow, Garrett & Dunner

[57] ABSTRACT

An integrated circuit package in which three conductor columns for connecting an insulating substrate and an integrated circuit are connected in parallel for use as I/O vias. Thereby, the conductor columns in a multilayer wiring portion between an integrated circuit and an insulating substrate is prevented from disconnecting.

3 Claims, 1 Drawing Sheet

INTEGRATED CIRCUIT PACKAGE HAVING A MULTILAYERED WIRING PORTION FORMED ON AN INSULATING SUBSTRATE

This application is a continuation of application Ser. No. 08/102,963 filed Aug. 6, 1993, now abandoned, which is a continuation of application Ser. No. 07/895,995, filed Jun. 8, 1992, now abandoned.

BACKGROUND OF THE INVENTION

The present invention relates to an integrated circuit package for mounting integrated circuits on an insulating substrate via a multilayer wiring portion having a plurality of laminated wiring layers including insulating films having a low dielectric constant.

A known integrated circuit package is provided with a multilayer wiring portion on an insulating substrate, the multilayer wiring portion including insulating films of polyimide resin, for instance, having a low dielectric constant, and integrated circuits which are mounted on the multilayer wiring portion so as to raise a signal transmission rate. The integrated circuits mounted thereon and the wiring of the insulating substrate are electrically connected via a conductor column formed in the multilayer wiring portion. In this case, only one conductor column has heretofore been used to electrically connect the integrated circuits and the wiring of the insulating substrate.

Such a conductor column may fail to conduct in case it is manufactured improperly. Once a conductor column fails to conduct, a signal can not be transmitted to the integrated circuit thus mounted nor taken out of it. Particularly when the disconnection of a signal path for an I/O port (I/O via) occurs, the integrated circuit package will become unusable.

SUMMARY OF THE INVENTION

In view of the foregoing problems, an object of the present invention is to provide integrated circuit package free from the disconnection of conductor columns for use in transmitting signals between integrated circuits and an insulating substrate.

The following technical means have been employed for an integrated circuit package according to the present invention.

The integrated circuit package comprises a multilayer wiring portion having a plurality of laminated wiring layers and integrated circuits mounted thereof, the wiring layers including insulating films having a low dielectric constant and conductor films, and an insulating substrate formed of insulating material and used to mount the multilayer wiring portion on the surface, the insulating substrate being provided with substrate wiring electrically connected via the multilayer wiring portion to the integrated circuits.

Further, conductor columns are provided in the multilayer wiring portion to connect the integrated circuits and the substrate wiring of the insulating substrate, the conductor columns being so arranged that a plurality of conductor columns are partially or totally connected in parallel.

When one conductor column is connected to another in parallel, it is highly improbable for the latter to fail to conduct even if the former fails to conduct. In other words, even though any one of the conductor columns connected in parallel fails to conduct, the other ones are kept in conduction. Therefore, a failure in conduction via conductor columns is prevented and this results in restraining an integrated circuit package from malfunctioning.

DESCRIPTION OF THE PREFERRED EMBODIMENTS

Figure 1:
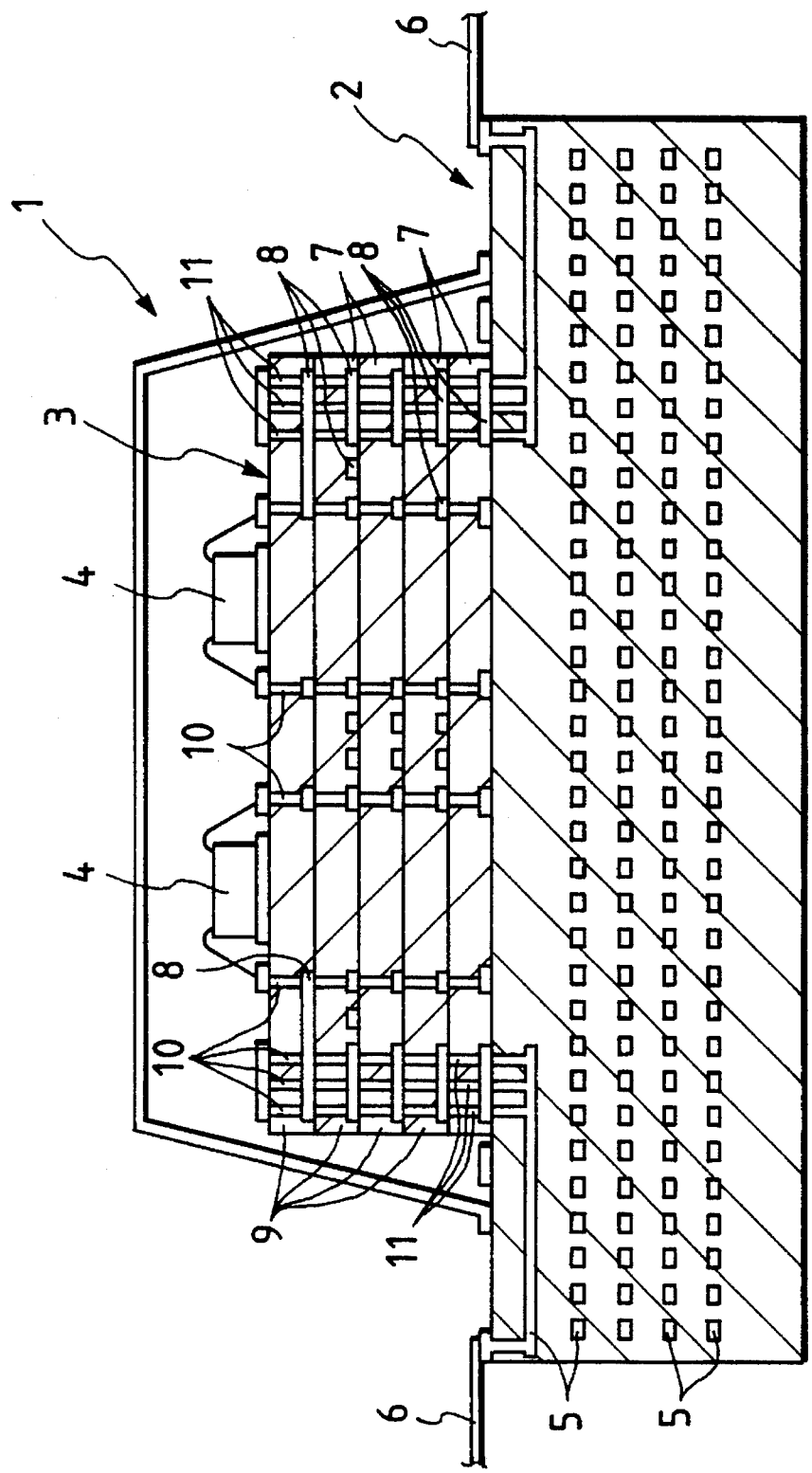
FIG. 1 is a sectional view of an integrated circuit package on which integrated circuits mounted.

Referring to the accompanying drawing, an integrated circuit package of the present invention will subsequently be described.

FIG. 1 is a sectional view of an integrated circuit package on which integrated circuits are mounted, illustrating an embodiment of the present invention.

An integrated circuit package 1 is provided with an insulating substrate 2 and a multilayer wiring portion 3 formed on the surface of the insulating substrate 2, a plurality of integrated circuits 4 being mounted on the surface of the multilayer wiring portion 3.

The insulating substrate 2 is a multilayer wiring substrate made of insulating material such as alumina, aluminum nitride and mullite; more specifically, substrate wiring 5 is printed on a green sheet mainly prepared from alumina. Subsequently, a plurality of green sheets are stacked and calcined at high temperatures in a moistening atmosphere of a hydrogen furnace. Then the substrate wiring 5 of the insulating substrate 2 is desirably connected to conductor columns in the multilayer wiring portion 3 as will be described later. Moreover, the substrate wiring 5 of the insulating substrate 2 is electrically connected to external leads 6 joined by soldering to the periphery of the surface of the insulating substrate 2.

The multilayer wiring portion 3 is formed of a plurality of laminated wiring layers 9 including insulating films 7 formed of insulating material (e.g., polyimide resin) having a low dielectric constant and conductor films 8.

In the multilayer wiring portion 3, there are formed conductor columns 10 passing therethrough from the surface thereof on which the integrated circuits 4 are mounted to the backside thereof in contact with the insulating substrate 2. As the conductor columns 10 are connected to the integrated circuits 4 and the substrate wiring 5 of the insulating substrate 2, the conductor columns 10 connected to the integrated circuits 4 and the conductor columns 10 (I/O vias) connected to the substrate wiring 5 are electrically and desirably connected by the conductor films 8.

In this embodiment, I/O vias 11 connected to the substrate wiring 5 of the insulating substrate 2, out of the conductor columns 10 formed in the multilayer wiring portion 3, are connected by the plurality of conductor columns 10 in parallel. In other words, three conductor columns 10 connected in parallel form the I/O vias of this embodiment.

Subsequently, the integrated circuit package of the embodiment above was prepared in order to make certain of a state of disconnection. The insulating substrate 2 of the integrated circuit package 1 used for testing was a square 3 mm thick with one side 100 mm long and green sheets were stacked layer on layer up to 15 layers before being calcined. Further, 900 external leads 6 were connected. The multilayer wiring portion 3 was also a square with one side 80 mm long, the square portion being formed by stacking 5 layers of insulating films 7, 25 μm thick, and 6 layers of conductor films 8. The conductor column 10 was formed by coupling a square conductor film with one side about 50 μm long onto the top of a conductor column about 30 μm in diameter. The number of I/O vias 11 was set at 900 sets corresponding to the 900 external leads 6, that is, 3×900.

In the case of an integrated circuit package with only one conductor column used for the I/O vias as the prior art, the rate in which that all of the 900 I/O vias are conducted is about 50%. On the other hand, according to the present invention, the rate of the all of the 900 I/O vias are conducted is 100%. Accordingly, a failure in conduction via conductor columns did not occur.

As set forth above in the embodiment, the I/O vias 11 can be prevented from failing to conduct by three conductor columns 10 to connect the I/O vias in parallel and this results in improving the reliability of such an integrated circuit package.

Although the present invention has been applied to the I/O vias, a plurality of other conductor columns or all of the conductor columns may be connected in parallel.

Although the present invention has been applied to the flat package, moreover, it may also be applicable to integrated circuit packages of other types such as a pin grid array type.

What is claimed is:

1. An integrated circuit package comprising:

a multilayer wiring portion having a first surface on which at least one integrated circuit is mounted and a second surface opposite the first surface, the multilayer wiring portion having a plurality of laminated wiring layers, said plurality of wiring layers including insulating films having a low dielectric constant and conductor films;

an insulating substrate formed of insulating material for mounting the second surface of said multilayer wiring portion thereto, said insulating substrate being provided with substrate wiring electrically connected through said multilayer wiring portion to the at least one integrated circuit; and an electrical connection for electrically connecting said at least one integrated circuit with the substrate wiring of said insulating substrate, the electrical connection including a grouping of a plurality of coextensive conductor columns extending through the multilayer wiring portion, said conductor columns of the grouping being electrically connected in parallel by the multilayer wiring portion to improve reliability of the electrical connection.

2. The integrated circuit package of claim 1, wherein the grouping of conductor columns of the electrical connection is used for signal path for an I/O port.

3. The integrated circuit package of claim 1 further comprising a second electrical connection having at least one conductor column extending through the multilayer wiring portion electrically independent of the grouping of conductor columns of the first electrical connection.

* * * * *

UNITED STATES PATENT AND TRADEMARK OFFICE
CERTIFICATE OF CORRECTION

PATENT NO. : 5,468,997
DATED : November 21, 1995
INVENTOR(S) : Ryuji IMAI et al

It is certified that error appears in the above-indentified patent and that said Letters Patent is hereby corrected as shown below:

Claim 2, Column 4, Line 20, replace "for signal path" with --as a signal path--.

Signed and Sealed this

Thirteenth Day of August, 1996

Attest:

BRUCE LEHMAN

*Attesting Officer*  *Commissioner of Patents and Trademarks*